which a portion of said first element is exposed; and (iii) putting into said recess a liquid medium carrying a first material; wherein said first material is preferentially deposited on the exposed inner surface of said body defining said recess, and wherein the deposited first material is used to provide a connection between said first element and a second conductive element located within said body or later deposited over said first surface of said body.

(12) United States Patent
Hayton et al.

(10) Patent No.: US 9,985,207 B2
(45) Date of Patent: May 29, 2018

(54) ELECTRONIC DEVICES

(75) Inventors: Carl Hayton, Cambridge (GB); Henning Sirringhaus, Cambridge (GB); Timothy Von Werne, Cambridge (GB); Shane Norval, Cambridge (GB)

(73) Assignee: FLEXENABLE LIMITED, Cambridge (GB)

( * ) Notice: Subject to any disclaimer, the term of this patent is extended or adjusted under 35 U.S.C. 154(b) by 631 days.

(21) Appl. No.: 11/720,979

(22) PCT Filed: Dec. 6, 2005

(86) PCT No.: PCT/GB2005/004665
§ 371 (c)(1),
(2), (4) Date: Nov. 2, 2007

(87) PCT Pub. No.: WO2006/061589
PCT Pub. Date: Jun. 15, 2006

(65) Prior Publication Data
US 2009/0232969 A1    Sep. 17, 2009

(30) Foreign Application Priority Data

Dec. 6, 2004  (GB) .................................. 0426679.7
Dec. 6, 2004  (GB) .................................. 0427181.3

(51) Int. Cl.
*H01L 51/00*    (2006.01)
*H01L 21/288*   (2006.01)
(Continued)

(52) U.S. Cl.
CPC ........ *H01L 51/0021* (2013.01); *H01L 21/288* (2013.01); *H01L 51/0017* (2013.01);
(Continued)

(58) Field of Classification Search
USPC ......................................................... 427/58
See application file for complete search history.

(56) References Cited

U.S. PATENT DOCUMENTS 5,141,897 A * 8/1992 Manocha et al. ............. 438/625
5,189,437 A * 2/1993 Michaelis et al. ............ 347/47
(Continued)

FOREIGN PATENT DOCUMENTS

EP      1 306 899 A1    5/2003
WO    2004/057674 A2    7/2004
(Continued)

OTHER PUBLICATIONS

J. H. Brannon, Excimer-Laser Ablation and Etching, IEEE Circuits and Devices Magazine. vol. 6, No. 5, pp. 18-24. Sep. 1990.*
(Continued)

*Primary Examiner* — Brian K Talbot
(74) *Attorney, Agent, or Firm* — Sughrue Mion, PLLC

(57) ABSTRACT

A method of producing an electronic device including the steps of: (i) providing a body including a first, conductive element separated from a first surface of said body by a portion of said body; (ii) removing a selected portion of said body to define a recess in said body extending from said first surface and via which a portion of said first element is exposed; and (iii) putting into said recess a liquid medium carrying a first material; wherein said first material is preferentially deposited on the exposed inner surface of said body defining said recess, and wherein the deposited first material is used to provide a connection between said first element and a second conductive element located within said body or later deposited over said first surface of said body.

10 Claims, 7 Drawing Sheets

(51) Int. Cl.
*H01L 21/768* (2006.01)
*H01L 51/05* (2006.01)

(52) U.S. Cl.
CPC .. *H01L 21/76802* (2013.01); *H01L 21/76804* (2013.01); *H01L 51/0541* (2013.01)

(56) References Cited

U.S. PATENT DOCUMENTS

| | | | |
|---|---|---|---|
| 5,260,169 A * | 11/1993 | Nakano | 430/314 |
| 5,841,099 A * | 11/1998 | Owen | C23C 14/046 219/121.69 |
| 6,501,663 B1 | 12/2002 | Pan | |
| 7,017,264 B2 * | 3/2006 | Ikeda | H05K 3/4617 29/846 |
| 7,384,862 B2 * | 6/2008 | Yamazaki | 438/610 |
| 2002/0151171 A1 | 10/2002 | Furusawa | |
| 2003/0059987 A1 * | 3/2003 | Sirringhaus et al. | 438/149 |
| 2004/0147133 A1 | 7/2004 | Yamazaki et al. | |
| 2005/0043186 A1 | 2/2005 | Maekawa et al. | |
| 2005/0226995 A1 * | 10/2005 | Maharshak et al. | 427/96.9 |
| 2006/0046088 A1 * | 3/2006 | Akram | H01L 21/288 428/620 |
| 2006/0046463 A1 * | 3/2006 | Watkins | H01L 21/76898 438/622 |
| 2006/0121199 A1 * | 6/2006 | Yang et al. | 427/304 |

FOREIGN PATENT DOCUMENTS

| | | |
|---|---|---|
| WO | 2004/070466 A2 | 8/2004 |
| WO | 2004/096451 A1 | 11/2004 |

OTHER PUBLICATIONS

Xue et al., Conducting Polypyrrole-based Field Effect Transistors Fabricated by Spin Coating and Inkjet Printing, Mat. Res. Soc. Symp. Proc. vol. 814, 2004.*
European Office Action dated Jun. 28, 2017 for corresponding European Patent Application No. 05 813 542.7.

* cited by examiner

ELECTRONIC DEVICES

The present invention relates to a method of producing an electronic device, particularly but not exclusively, to a method of creating and filling via holes in order to provide a continuous electrical connection between layers within an electronic device.

Many existing processes to produce connecting via holes within the prior art involve the use of techniques such as vacuum processing or wet plating methods to produce conductive layers that connect into via holes. Laser ablation combined with electroless plating of copper is a common technique for fabrication of via hole interconnection in high density multilayer printed circuit boards.

In patent number US20020158307, the conductive layers of a substrate are deposited using vacuum processing methods. A metallic thin film is applied to a substrate with a metal thin film formation device. The metallic thin film can be formed by such well-known vacuum processes as vapour deposition, sputtering, or ion plating. Via holes are then formed through the layers of the substrate and filled with conductive material. The conductive material electrically connects the metallic thin film layers. The metal thin films are not exposed at the periphery, so that corrosion of the metal thin films is not likely to occur.

In patent number US20020090814, a substrate composed of a layer of insulator material, such as $SiO_2$ is deposited on top of a semiconductor layer. Via holes are formed within the insulator layers, having a diameter of 0.15 µm and a depth of 0.9 µm (aspect ratio: 6). Thereafter, copper is filled into the via holes by performing a process of wet plating (electroplating or electroless plating) to form copper interconnects.

However, the prior art has many potential failure points. Vacuum processing techniques require a chamber in which the component is loaded to be evacuated of air. In order to achieve this, a lengthy pump down process is required. A relatively thick metal film is required to ensure electrical conduction through the via hole, particularly for high aspect ratio vias. For high aspect ratio vias it may be difficult to ensure continuous coverage of the side walls due to shadowing effects.

The wet plating techniques require chemical compatibility to the various resists as well as the etch and rinse solutions in addition to the exposed polymer layers on the substrate stack. This is particularly a concern when the substrate already contains sensitive active electronic devices, such as transistors. In particular, for transistors containing organic materials such as molecular or polymer semiconductor degradation of the electronic properties of the active elements during a wet plating step is difficult to avoid. Wet plating solutions also cause concerns in terms of their hazardous nature and their environmental disposal.

A method of creating via holes using solvents to locally dissolve and redeposit the material of the layers of a device into a ring around the edges of the created via hole are also known in the prior art (US20030060038). By redepositing the material of the layers around the edges of the created via hole, the underlying conductive layer surface is exposed. If multiple solvent drops are required for dissolving a thick dielectric layer this is a time-consuming process as it is necessary for each deposited solvent drop to evaporate before the next drop may be deposited. This process is appropriate for via holes that are required through thin dielectric layers of a device. The solvent etched vias were filled by inkjet printing of multiple droplets of a conducting polymer into the via-hole, the formation of an electrical interconnection in this way is facilitated by the relatively smooth side walls of inkjet etched vias and the relatively small depth of the inkjet etched vias (<1 µm). This process is time-consuming since several droplets need to be printed into each hole.

In the prior art, connection to buried conductive layers is usually made to the surface of the buried conductive layer. The process disclosed in the present invention provides a high yielding interconnection in situations where it cannot be ensured that the conductive layer is not removed from the substrate by the method with which the via-hole through the multilayer structure is opened.

Furthermore, in the prior art the filling of via holes through thick dielectric layers with a thickness of 1-20 µm requires long process times and large amount of material to be deposited. In the present invention a filling method is disclosed which establishes a high yielding, reliable interconnection in a single solution coating or single pass printing step.

A further problem of the methods disclosed in the prior art is related to the thickness of the buried layer to which an electrical interconnection is to be made. In typical printed circuit board applications the copper layers have a thickness of more than 1 µm. However, for circuits which contain active electronic devices, such as transistors where via hole interconnections to buried electrodes with a thickness on the order of 100 nm need to be formed with high yield, the methods disclosed in the prior art are not applicable, since they do not allow formation of high yield interconnections to such thin buried electrodes.

It is one aim of the present invention to provide an alternative technique for creating connections between conducting elements at different levels of an electronic device.

According to one aspect of the present invention, there is provided a method of producing an electronic device including the steps of: (i) providing a body including a first, conductive element separated from a first surface of said body by a portion of said body; (ii) removing a selected portion of said body to define a recess in said body extending from said first surface and via which a portion of said first element is exposed; and (iii) putting into said recess a liquid medium carrying a first material; wherein said first material is preferentially deposited on the exposed inner surface of said body defining said recess, and wherein the deposited first material is used to provide a connection between said first element and a second conductive element located within said body or later deposited over said first surface of said body.

According to another aspect of the present invention, there is provided a method of producing an electronic device including the steps of: (i) providing a body including a first, conductive element separated from a first surface of said body by a portion of said body; (ii) removing a selected portion of said body to define a recess in said body extending from said first surface and via which a portion of said first element is exposed; and (iii) putting into said recess a liquid medium carrying a first material; wherein a continuous deposit of said first material is formed on the exposed inner surface of said body defining said recess up to a first level without said recess being filled to said first level with said first material, and wherein the deposited first material is used to provide a connection between said first element and a second conductive element located within said body or later deposited over said first surface of said body.

In one embodiment, the recess in said body is defined by laser ablation of said body.

In one embodiment, said first material is a conducting polymer.

In one embodiment, said first material comprises a nanoparticle metal or metal precursor.

In one embodiment, said first material is deposited by solution coating.

In one embodiment, said first material is deposited by spin coating or blade coating.

In one embodiment, wherein said first material is deposited by printing.

In one embodiment, said first material is deposited by inkjet printing.

In one embodiment, the thickness of said body in between said first surface of said body and said first element exceeds 1 µm, particularly 5 µm.

In one embodiment, a continuous deposit of said first material extends up to a portion of said first surface, without said recess being filled with said first material up to said first surface.

In one embodiment, said first and second elements form conducting elements of the electronic device.

In one embodiment, said second element is formed by the conductive first material.

In one embodiment, said second element is formed in the same deposition step as depositing said first conductive material into said recess.

In one embodiment, said second element is formed from a second conductive material.

In one embodiment, said body includes said second element at a level higher than said first element and separated from said first element by a portion of said body, and wherein a continuous deposit of said first material extends over the surface of said body defining said recess from said first element to said second element without said recess being filled up to the level of said second element with said first material.

In one embodiment, said body includes (a) a substrate, (b) said first element formed on said substrate, and (c) one or more layers formed on said first element; and wherein said recess extends through said one or more layers and said first element, and partly extends into said substrate.

In one embodiment, said electronic device is a transistor including a semiconducting channel between two electrodes, and said first element forms one of said two electrodes.

One embodiment includes the step of treating the exposed inner surface of said body defining said recess so as to increase the wettability thereof for said liquid medium carrying said first material.

In one embodiment, said step of removing a selected portion of said body to define said recess and said step of treating the surface of said body defining said recess so as to increase the wettability thereof for said liquid medium carrying said first material are carried out simultaneously.

In one embodiment, said first body is a polymer dielectric.

In one embodiment, said first element forms an electrode of an electronic switching device.

In one embodiment, said second element forms the pixel electrode of a display element in an active matrix display.

In one embodiment, said pixel electrode extends laterally over at least a portion of said electronic switching device.

In one embodiment, said body includes a third element in between said first element and said first surface of said body, and wherein said deposited first material is used to form an electrical connection between said second and third elements.

In one embodiment, said body includes a third element in between said first element and said first surface of said body, and wherein said deposited first material is used to form an electrical connection between said first and third elements.

In one embodiment, the liquid medium carrying the first material contains a surfactant.

According to another aspect of the present invention, there is provided a method of producing a via hole interconnection through a multilayer structure of an electronic device by a process of laser ablation, and filling of vias by deposition of a liquid mixture comprising a conductive material.

One embodiment involves a two-stage process for creating via hole interconnections to a buried electrode of an electronic device on a substrate through a thick dielectric layer. The process is based on laser ablation of the layers of the electronic device to form the via hole and filling of the via hole with a conductive fluid.

According to another aspect of the present invention, there is provided an electronic device produced by a method as described above.

To help understanding of the invention, specific embodiments thereof will now be described by way of example and with reference to the accompanying drawings, in which.

Figure 1:
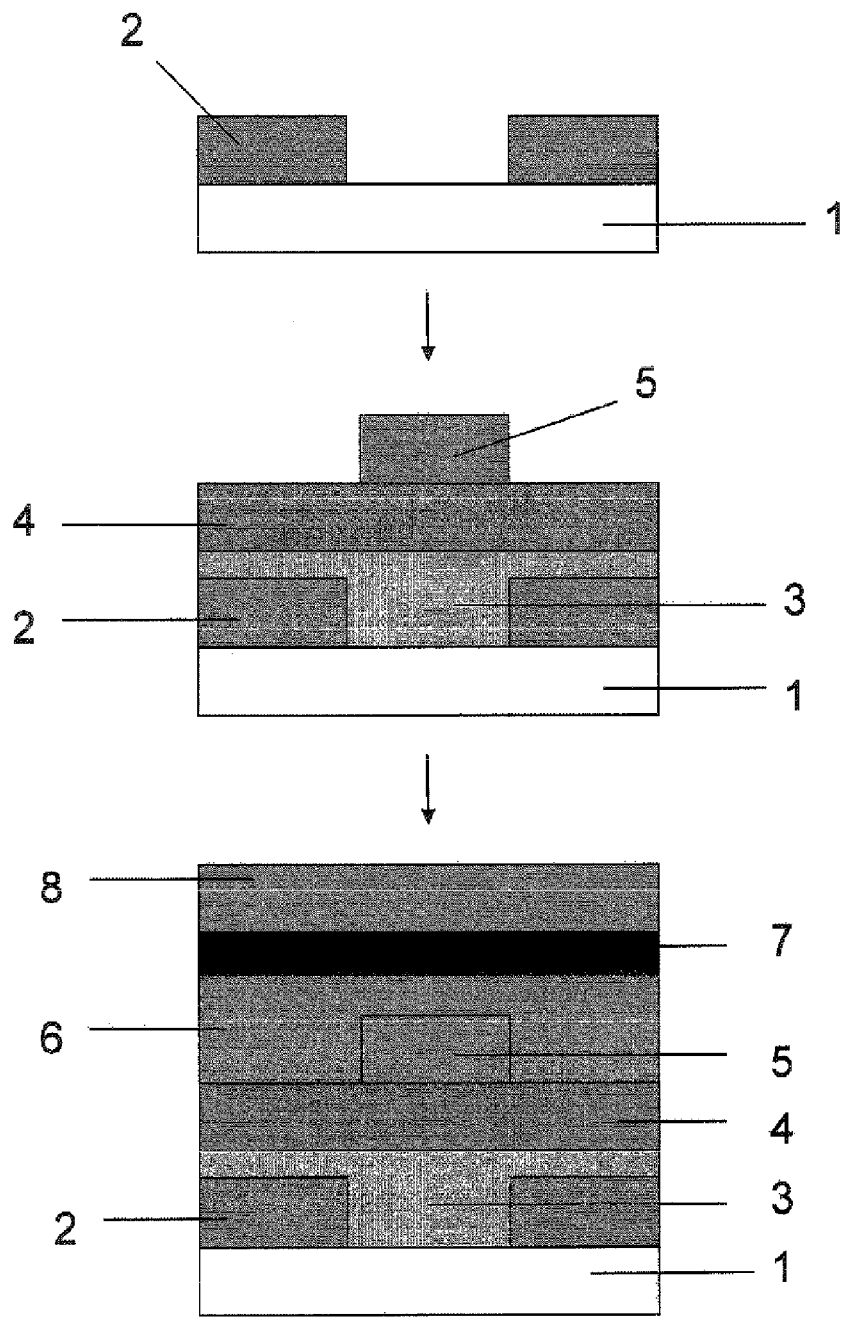
FIG. 1 illustrates a multilayer substrate.

With reference to FIG. 1, an example of a multilayer substrate is described below. It contains a first conducting layer 2, and might also contain other layers of the electronic device, such as other conducting structures, semiconducting layers, and dielectric layers (FIG. 1). The first conducting layer may be an inorganic metal deposited either as a thin film from vapour phase or from liquid phase. The first conducting layer may also be a conducting polymer layer. The first conducting layer can be patterned by techniques such as, but not limited to, photolithography, direct-write printing, or laser ablation. The first conductive layer is preferably an electrode of the electronic devices and has a thickness of less than 300 nm. The substrate also contains a dielectric layer 6 deposited on top of the first conducting layer. The dielectric is preferably an organic dielectric, such as a solution processible polymer dielectric, or a organic dielectric deposited by chemical vapour deposition. The dielectric might also be an organic-inorganic hybrid dielectric, or an inorganic dielectric, such as a spin-on-glass or a CVD deposited inorganic dielectric such as silicon oxide or silicon nitride. The substrate might also contain other dielectric, conducting or semiconductive layers (3,4,5,7) located in between the surface of the substrate and the first conductive layer. Therefore, the substrate example has a multilayer structure comprising at least one dielectric layer, and other conductive and semiconductive layers deposited on top of the first conductive layer. An embodiment of the present invention is a high-yielding process for establishing an electrical via hole interconnection through the multilayer structure between the first conductive layer and a second conductive layer 9.

A first embodiment provides a method of producing a via hole interconnection through a multilayer structure of an electronic device by a process of laser ablation, and filling of vias by deposition of a liquid mixture comprising a conductive material. The multilayer structure, the laser ablation process conditions, the via hole post processing conditions, and the composition and solution deposition conditions of the liquid conductive mixture are chosen such as to provide good wetting properties for the conductive ink on the side wall and across the edge of the via hole. In its most preferred embodiment the laser via hole penetrates through the buried conductive layer to which an electrical contact is to be made, and the electrical connection is made through the exposed side wall of the buried conductive layer.

The laser is preferably an excimer laser, most preferably a pulsed excimer laser that irradiates the substrate in local spots. The shape of the spots can be defined, for example, using a focussed laser beam scanned across the substrate or using a mask projection system. Preferably the diameter of the spot is on the order of 1-100 µm, more preferably on the order of 5-20 µm. In each exposure of the substrate the laser irradiation removes material of the multilayer structure from the substrate to open up the via hole 8. The number of exposures, and the exposure conditions (power, exposure duration) are chosen such that a portion of the first conductive layer is uncovered and exposed.

Figure 2:
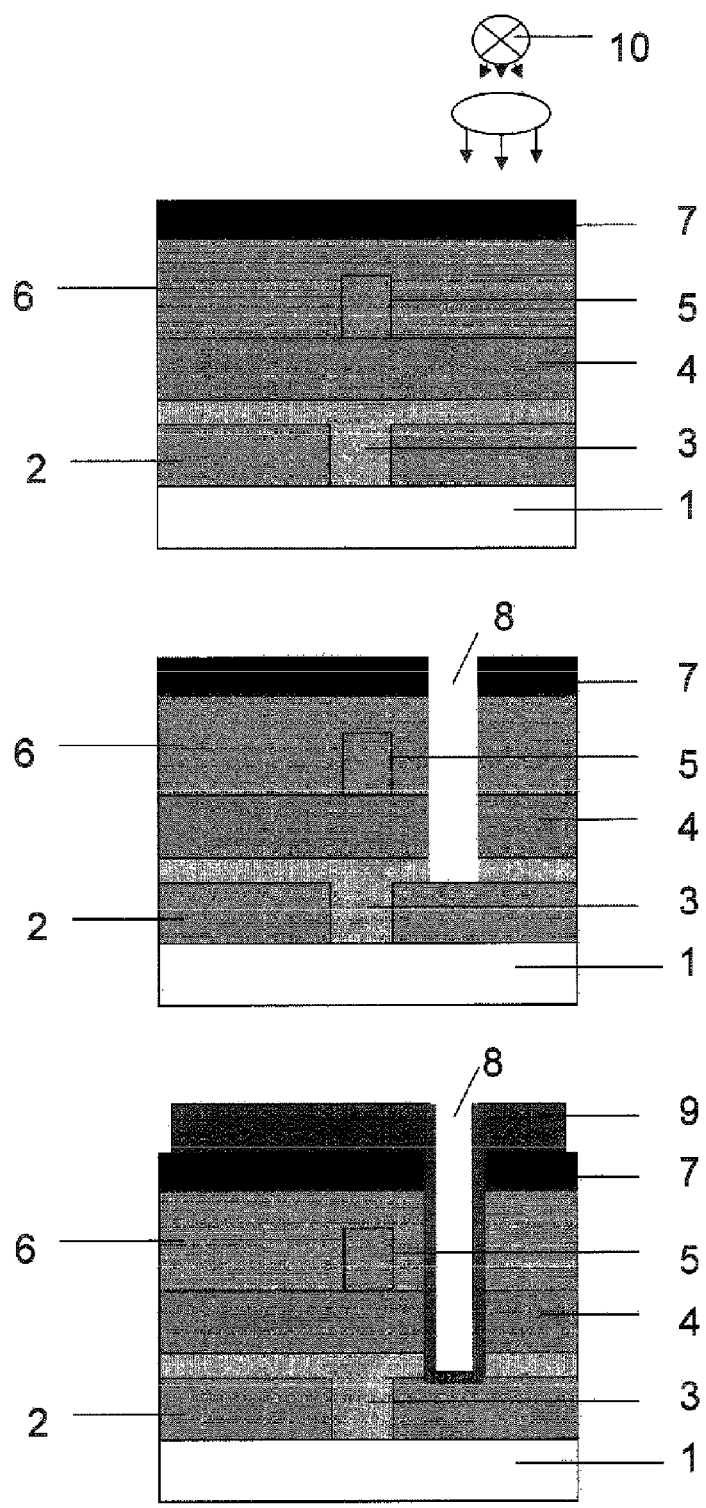
FIG. 2 illustrates a process sequence for generation of via holes in the multilayer structure by laser ablation, and filling them by solution deposition of a conductive material to connect to the surface of a buried conducting layer according to an embodiment of the present invention.

According to one embodiment the exposure conditions are adjusted such that the first conductive layer is exposed on its surface in the plane of the substrate. This is preferred if the ablation threshold of the first conductive layer is significantly higher than that of the layers of the multilayer structure. In this situation the surface is in fact cleaned by firing further shots to ensure complete removal of any residual material and surface contamination off the surface of the first conductive electrode without ablating the first conductive layer (FIG. 2). A clean surface is crucial for establishing a reliable and low resistance via hole interconnection.

Figure 3:
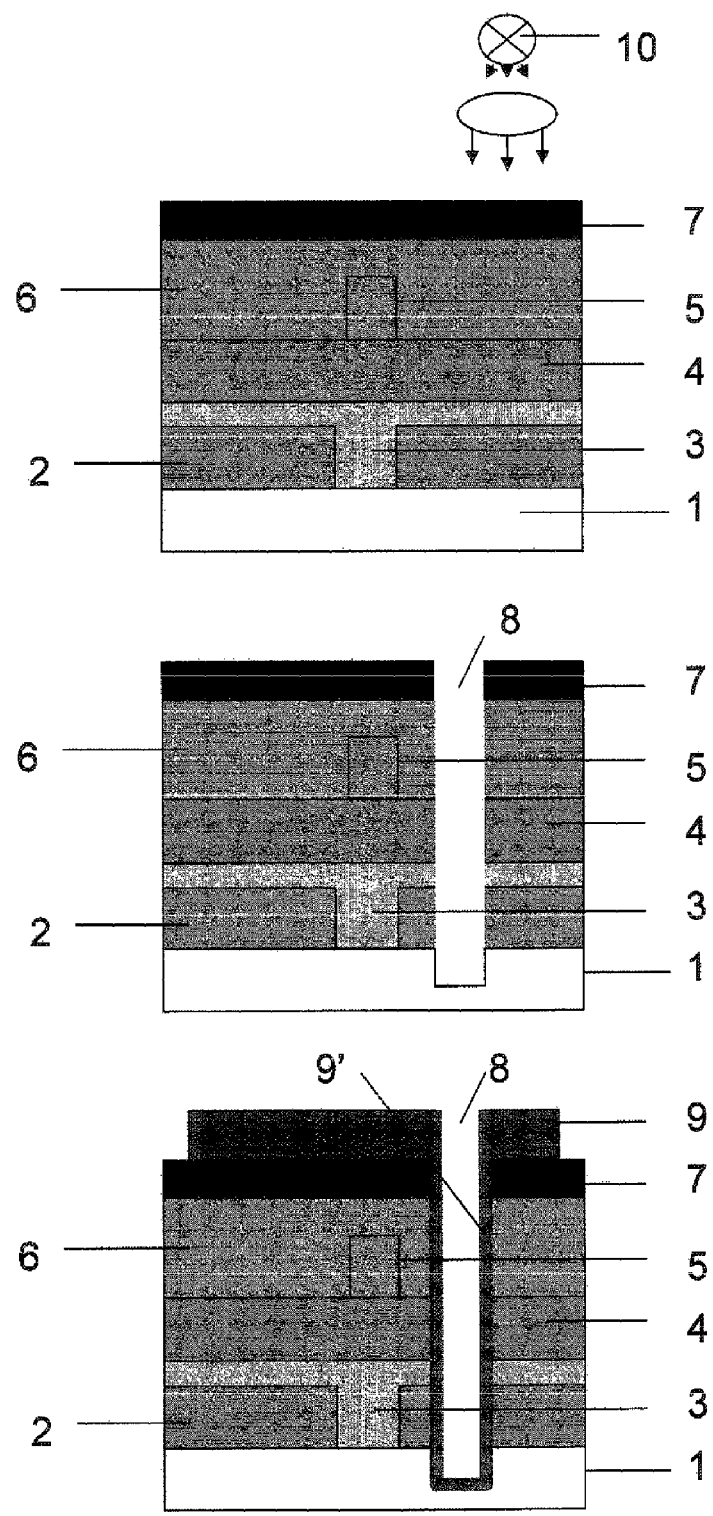
FIG. 3 illustrates another process sequence for generation of via holes in the multilayer structure by laser ablation, and filling them by solution deposition of a conductive material to connect to the side wall of a buried conducting layer according to an embodiment of the present invention.

According to another embodiment exposure conditions are used which ablate through the layer of conductive material, and form the interconnection to the side wall of the first conductive layer which is exposed along its thickness in the shape of an annular ring (FIG. 3). This is preferred in many practical situations, if the first conductive layer has a similar ablation threshold than the other layers of the multilayer structure, or is removed from the substrate by the laser irradiation due to poor adhesion to the substrate. This process requires sufficient shots per via hole such that it can be ensured that the via hole goes through the layer of conductive material. Once the via hole is deeper than the position of the first conductive material (FIG. 3), the process becomes relatively insensitive to the depth of the via hole, and therefore yields a high yield and reliable interconnection even if the deposited laser energy may vary. This overcomes a common problem with excimer lasers which can fail to deliver shots or can deliver shots with variable energy. This process provides a high yielding interconnection in situations where it cannot be ensured that the conductive layer is not removed from the substrate by the method with which the via-hole through the multilayer structure is opened, as is the case for many polymer multilayer structures on flexible plastic substrates.

The multilayer structure is arranged such as to provide good wetting properties for the conductive ink across the edges and on the side wall of the via hole to result in a high yield formation of an electrical connection between a buried first conductive layer and a second conductive layer on the surface of the electronic device. The composition of the liquid, the wetting properties of the different layer of the substrate, and in particular of those portions of the layers that are exposed on the side wall of the via hole, and the liquid deposition conditions are arranged such that a continuous conductive path is formed with very high yield and reliability from the first conductive layer through the multilayer layer structure comprising at least one insulating material to the second conductive layer on the substrate.

It is desirable that if a printing process such as inkjet printing or a continuous coating technique such as spin coating are used to fill the via hole the electrical interconnection can be formed in a single pass printing or solution coating step, even if the depth of the via hole is much higher than the thickness of the deposited second conductive layer.

Figure 4:
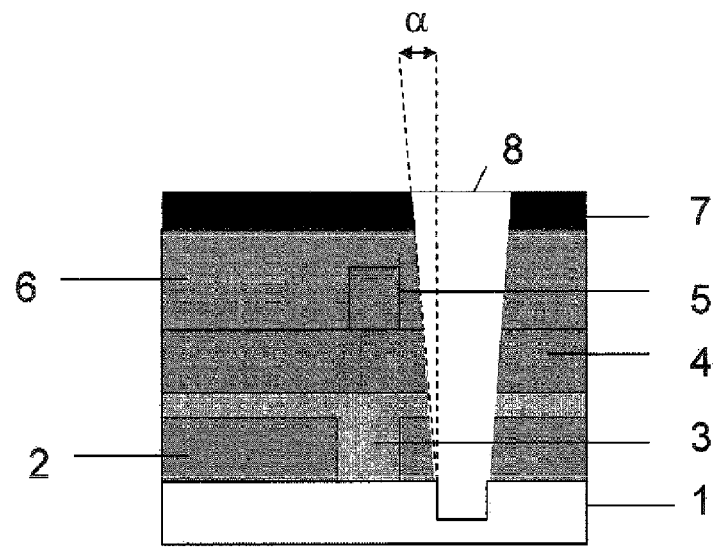
FIG. 4 shows a via-hole with a finite taper angle.

The resultant topology of the via hole may be tapered such that the base of the via hole is of a smaller diameter than the surface of the top of the via hole. This feature of the via hole may be formed, for example, by a method of multiple-shot, focussed laser ablation. The taper angle $\alpha$ (FIG. 4) can be adjusted with the number of shots, the shape, energy and power of each shot. A finite taper angle facilitates the reliable formation of the via hole interconnection in the subsequent liquid deposition step. Preferably the taper angle is between 5° and 45°.

A wetting layer 8 may be deposited on the surface of the substrate prior to the step of laser ablation in order to ensure good wetting of the liquid ink across the edge of the via-hole and on the side wall. The wetting layer ensures good adhesion of the layer 9 to the substrate in particular near the edge of the via hole, where the presence of debris or the abrupt edge might otherwise cause the conductive ink to dewet, and in this way interrupt the conduction path to the first conductive layer.

The laser ablation process may be conducted in an atmosphere which produces a side wall surface with a high surface tension that promotes the wetting of the liquid ink. For example, the laser ablation process may be conducted in an oxidative environment in which radicals produced during the step of ablation react with gaseous species in the atmosphere to produce a polar surface on the side walls during the ablation process. This method is particularly useful if one of the layers in the stack is a material which has poor wetting properties for the liquid ink, such as for example a low-k interlayer dielectric in combination with a water-based liquid conductive ink. However, care needs to be taken that the surface of the first conductive layer does not oxidize significantly in order not to increase the contact resistance between the first conductive layer and the liquid-phase deposited conductive material with which the via is filled.

The substrate may be subject to a surface treatment step, such as an oxygen plasma treatment step prior to filling of the via holes. This step is meant to improve the wetting properties of the liquid conductive ink across the edge of the via hole and on its side wall.

The different layers of the multilayer structures, in particular the top wetting layer, and the conditions for laser ablation are chosen such as to avoid delamination of the layers from each other at the edge or along the side wall of the via hole. This is achieved by adjusting the laser power with respect to the ablation thresholds of the various materials in the multilayer structure, and ensuring good adhesion of the layers to each other and to the substrate.

The via-hole is filled by depositing a liquid mixture of a second conductive material into the via-hole to form an electrical connection 9' between the first conductive layer 2, and a second conductive layer 9. The liquid mixture is deposited either as a continuous film by techniques, such as but not limited to, spin coating, blade coating, spray or meniscus coating, or in patterned form by a printing technique such as inkjet, offset, gravure or screen printing.

Preferably, the liquid processible conductive material is a conductive polymer, such as polyethylene-dioxythiophene doped with polystyrene sulphonic acid (PEDOT/PSS) or polyaniline (PANI). Both water as well as solvent based dispersions can be used. The lower surface tension of a solvent based ink facilitates the prevention of dewetting of the liquid ink at the edge or on the side wall of the via-hole. Without wanting to be bound by theory the mechanical properties of a conductive polymer provide a high yielding, and reliable interconnection across the side wall of the via hole even if the thickness of the deposited second conductive material is much smaller than the depth of the via-hole. Conducting polymers have conductivities on the order of 1-100 S/cm. Their use is particularly suitable for applications, for which the conductance of the via hole interconnection and the second conductive layer is not required to be very high. These include applications where the second conductive layer does not carry a current, but constitutes, for example, the electrode of a capacitor which draws little or no current.

If higher conductivities are required, the liquid processible conductive material may be a solution/dispersion of inorganic nanoparticles, or chemical precursor molecules, which need to be converted into a highly conducting form by post-deposition annealing or light exposure. With such materials conductivities close to those of bulk metals can be achieved, but care needs to be taken that the conducting film remains continuous across the topographic structures at the edges and on the side wall of the via hole.

Preferably, the process step of filling the created via hole with conductive material is conducted by using an ink jet printing system which may dispense an number of picolitre droplets into each via at rates in excess of 10 k Hz. The surface properties of the inside surface area of the via hole and the properties of the chosen conductive material are such that the conductive material, when deposited into the via hole, wets the side wall and connects to the remaining annular material ring of the first conductive layer (FIG. 3) or to its surface (FIG. 2). This occurs as the solvent of the deposited conductive material evaporates.

The method of depositing the conductive material by solution processing techniques, such as ink jet printing is very efficient. The process only deposits a thin layer of conductive material. It also allows patterning the conductive layer 9 in the same step as filling the via holes.

According to another preferred embodiment of the invention the conductive material is deposited by a continuous coating technique such as spin coating, which provides a faster, although less materials efficient, way of depositing the conducting material. The conducting material can be patterned in a subsequent step by subtractive patterning techniques such as photolithography or laser ablation.

Preferably, the conductive layer 9 is formed in the same process step in which the via hole is being filled (FIG. 2,3).

Figure 5:
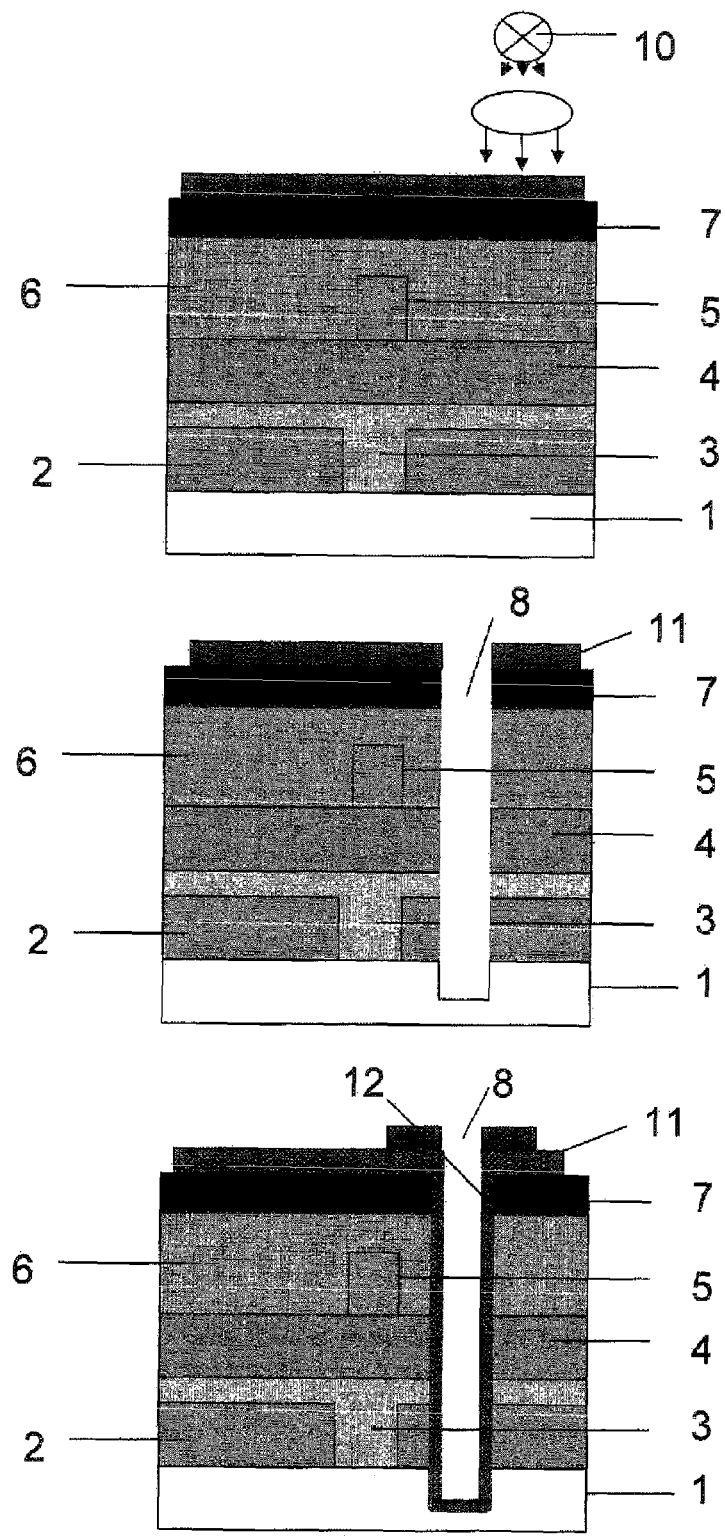
FIG. 5 shows yet another process sequence for generation of via holes in the multilayer structure by laser ablation, and filling them by solution deposition of a conductive material according to an embodiment of the present invention.

Alternatively (FIG. 5), the second conductive layer is present on the substrate prior to the laser ablation step 11, and is being connected by the liquid deposited material 12 to the first conductive layer. It is also possible to deposit the second conductive layer after forming the via holes onto the surface, and connect it through the via hole to the first conductive layer using a liquid deposition step.

The thickness of the layer 6 is preferably in the range of 0.1-20 μm, most preferably in the range of 1 to 12 μm, most preferably 5-10 μm to provide good electrical isolation of the top conductive layer to any of the layers underneath such as for example, the gate electrodes 5. The present invention provides a filling method which establishes a high yielding, reliable interconnection through such deep via-holes in a single solution coating or single pass printing step.

A typical 248 nm 100 W excimer laser can ablate approximately 0.5 μm of absorbing polymer per pulse, being operated at a repeat frequency of around 200 Hz, and being exposed to an area with dimensions in excess of 1 mm×1 mm and at a fluence above the ablation threshold, typically >0.5 J/cm$^2$ for most polymers. A higher throughput industrial 248 nm Excimer laser could increase the size of the area ablated further. A high throughput laser ablation process combined with a multiple nozzle inkjet deposition process is thought to be a low-cost manufacturing solution for vertical interconnections.

Figure 6:
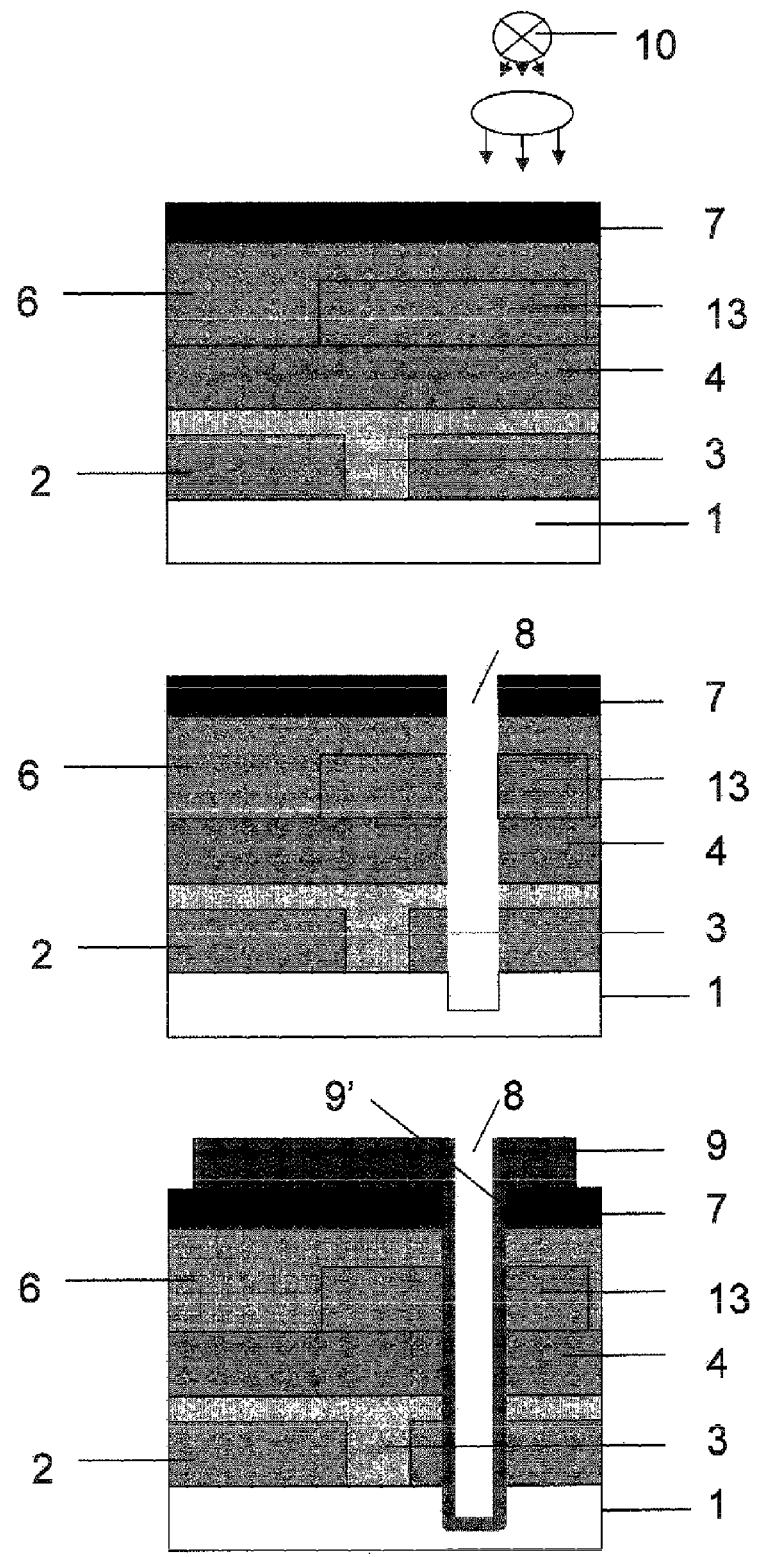
FIG. 6 shows another embodiment of the invention for connecting more than two conductive layers with a via hole interconnection.
Figure 7:
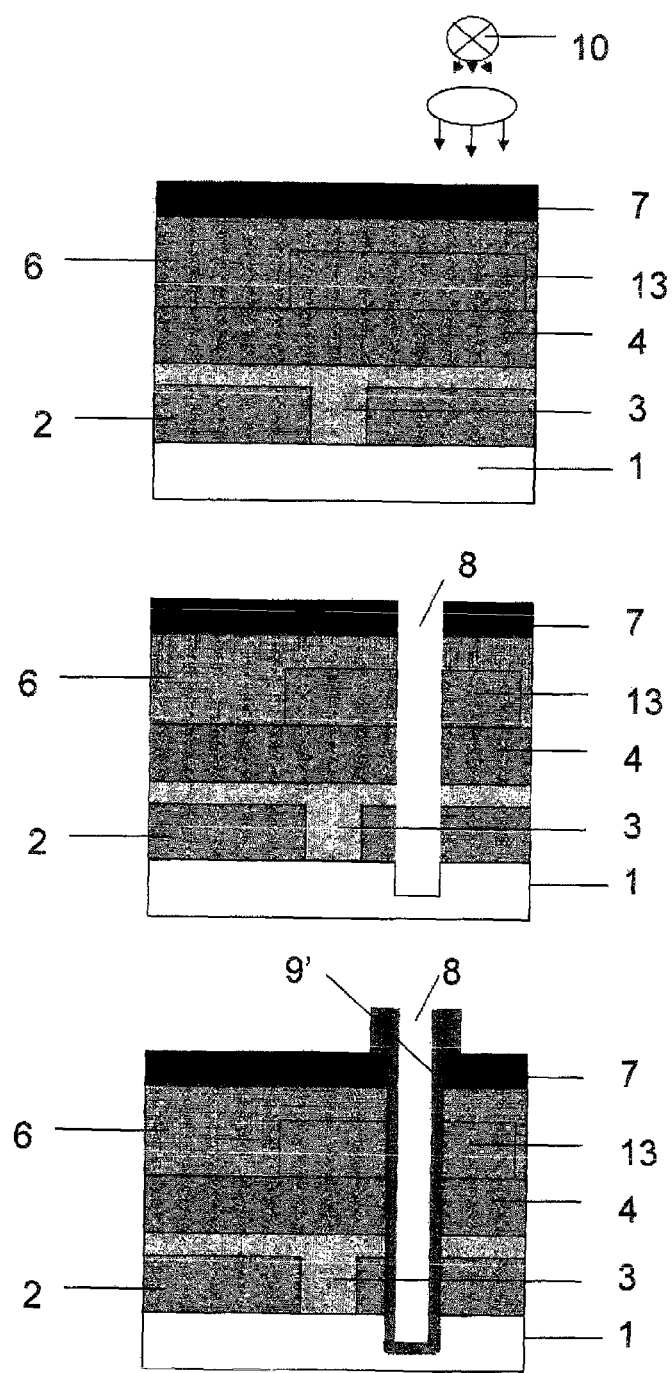
FIG. 7 shows another embodiment of the inventions for connecting two buried conductive layers with a via-hole interconnections.

In a second embodiment of the present invention, the above described process may also be used for connecting multiple conductive layers buried within a layered stack (FIG. 6). This process may also be used to create via holes between two buried conductive layers, positioned at any level within a layered stack (FIG. 7).

One embodiment is a method of connecting conductive layers within an electronic device that are isolated by layers of non-conductive material.

With reference to the drawings, the first embodiment of the present invention is now described in more detail. A substrate 1 is coated with a thin layer of conductive material 2. The substrate may be either glass or a polymer film. According to a preferred embodiment of the invention the substrate is a plastic substrate, such as a film of polyethyleneterephtalate (PET) or polyethylenenaphtalene (PEN). A first conductive layer 2, which is preferably a metallic layer, and most preferably a layer of inorganic metal such as gold or silver may also be used or any metal that adheres well to the substrate. A bilayer structure may be deposited, including a seed or adhesion layer in between the layer of metallic material and the substrate. Alternatively, a conductive polymer may be used, such as PEDOT/PSS. The conductive material is preferably deposited using solution processing techniques such as spin, dip, blade, bar, slot-die, or spray coating, inkjet, gravure, offset or screen printing. An evaporation process may also be used to deposit a metallic layer, but preferably a sputtering technique is used. The first conductive layer is generally patterned and may form, for example, the source and drain electrodes or the gate electrode of a transistor device. The patterning may be achieved by a process such as, but not limited to, photolithography, laser ablation or direct-write printing. Other processes that may be used include shadow mask evaporation or other printing and etching methods.

Subsequently a sequence of further conducting, dielectric and semiconducting layers is deposited on top of the first conductive layer.

For example, in the case of a transistor device in top-gate configuration, once the metallic layer has been patterned to form source and drain electrodes, a layer of semiconducting material 3 is deposited over the substrate. The semiconducting material may be a semiconducting polymer such as a polytriarylamine, polyfluorene or polythiophene derivative. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, blade coating or dip coating, curtain coating, meniscus coating, spray coating, or extrusion coating, spin-coating onto the substrate. The typical thickness of the semiconducting layer is on the order of 50 nm after solvent evaporation. In addition, an evaporative process may also be used. A preferred technique is ink jet printing. If the layer is ink jet printed, a minimum amount of semiconductor material may be used, which is both environmentally and economically advantageous.

Then a layer of gate dielectric 4 or a sequence of dielectric layers is deposited on top of the semiconducting layer. Materials such as polyisobutylene, polymethylmethacrylate, polystyrene or polyvinylphenol may be used for the dielectric layer. The dielectric material may be deposited in the form of a continuous layer, by techniques such as, but not limited to, spray or blade coating. However, preferably, the technique of spray coating is used. The typical thickness of the gate dielectric layer is between 150-1000 nm.

The deposition of the layer of dielectric material is then followed by the deposition of a gate electrode 5 and interconnect lines. The gate electrode and interconnect lines may consist of a conducting polymer, such as polyethylenedioxythiophene doped with polystyrene sulfonic acid (PEDOT/PSS). However, the gate electrode is preferably a metallic material, such as gold, but most preferably, a printable liquid containing inorganic nanoparticles of silver or gold. The gate electrode is deposited and patterned using techniques such as sputtering or evaporation photolithography or deposited and patterned by solution processing techniques such as spin, dip, blade, bar, slot-die, gravure, offset or screen printing. Preferably, the gate electrode is deposited by ink jet printing. A gate electrode wetting layer, such as a layer of polyvinylphenol, may be deposited onto the substrate prior to the printing of the metal ink.

The silver deposited gate and interconnect lines created by this process are then annealed with an IR laser beam to improve the conductivity.

A top dielectric layer 6 is then added to the layered stack. Preferably, the top dielectric layer is an organic dielectric or an organic-inorganic hybrid dielectric. The layer of dielectric material may, for example, be a layer of chemical vapour deposited parylene. Alternatively, a number of layers of dielectric material may be deposited at this stage, including layers of material such as solution coated polystyrene or PMMA. These layers of dielectric material can be coated by any large area coating method, such as spin coating, spray coating, or blade coating. The thickness of the layer 6 is preferably in the range of 0.1-20 µm, more preferably in the range of 1 to 12 µm, most preferably 5-10 µm to provide good electrical isolation of the top conductive layer to any of the layers underneath such as for example, the gate electrodes 5.

A wetting layer 8 may then be deposited over the dielectric layer(s). The wetting layer is deposited to ensure the adhesion of the layer of conducting material 9 to the insulating dielectric surface as well as at the edge of the via hole. The wetting layer adjusts the surface energy of the layered substrate to facilitate the deposition of the subsequently deposited layer of conductive ink 9. The wetting layer may be deposited from solution using techniques such as, but not limited to, spincasting, ink-jet printing, spray-coating, roller coating spray or blade coating. However, preferably, the technique of spray coating is used. As described above, the wetting layer also is required to be deposited in such a way so as to not degrade the underlying layers. An example of a material that may be used for the wetting layer is polyvinylphenol. This polymer is soluble in polar solvents, such as methanol or isopropanol.

In order to produce the via holes 11, a 248 nm (Lumonics PM800) excimer KrF laser 10 is used with a fluence in excess of the ablation threshold of the primary polymer. For example, in the case of parylene, the fluence is preferably >1 $J/cm^2$. The substrate is placed in the imaging plane of the laser beam and the chuck levelled such that the fluence and via diameter remain consistent across the display. Optics may be used that have a sufficiently large depth of field or, alternatively, map the topology of the substrate surface such that the laser is able to accommodate for any deviations in the required focal length. In addition, pattern recognition may be used to locate the fiducials at as many points as are required by the size and the level of distortion of the flexible substrate. A homogeneous laser beam is then passed through a Chrome on Quartz mask, suitable for 10× demagnification at the substrate. It is important that the laser beam is uniform across the mask area, such that each via hole receives the same dose of the laser beam. The demagnification of the system may be modified to reflect the exact requirements of the process.

The diameter of the via hole on the substrate is preferably between 1-100 µm, most preferably between 5-20 µm. The depth of the via hole is in excess of the total thickness of the materials stack and may continue into the substrate. The preferred process is a step and repeat process, but a process of constant velocity scanning with a system with sufficient accuracy to allow laser pulses to be matched to positions on the substrate, may also be used. This constant velocity process will enable much reduced process times.

The process requires sufficient shots per via hole such that the depth of the via hole is at least exposing a portion of the first conductive layer. Preferably, the via-hole goes through the layer of conductive material or deeper to ensure a high yield. One the via hole is deeper than the position of the first conductive material (FIG. 3), the process does not require particularly accurate depth control, as the electrical contact is made to a ring of remaining material of this first conductive layer on the substrate.

Alternatively, if the relative ablation thresholds of the materials in the multilayer stack and that of the first conductive material allow, the exposure conditions are chosen such that the surface of the first conductive material is cleaned of material and ablation residues, but the first conductive material is itself not ablated.

As the process ablates the non-transparent (i.e. Au) parts of the substrate an optical method of determining the success of the via holes may be incorporated. Additional laser shots may be used to counter the occasional low energy pulse of an excimer laser and any variation in the thickness and absorbency of the material stack. The number of shots however must be minimised such that the constant velocity scanning process may be minimised and the creation of debris may be kept to a minimum.

The above described process may result in the creation of a ring of debris of redeposited ablated material around the top of the formed via hole. It is important that the creation of this debris is kept to a minimum, as excess debris may affect the wetting properties of the deposition of the layer of conductive material. The debris may be kept to a minimum by applying a jet of gas at the point of ablation to disperse the non-gaseous particles that are ejected. A high velocity jet of gas may remove these particles, such that they do not adhere to the substrate. A jet of clean dry air has been used effectively for this purpose.

The ablation process is performed in normal atmospheric conditions. For many polymer dielectric and semiconductive materials this ensures that during the ablation process a high energy surface is generated on the side walls of the via hole, which provides good wetting properties for the subsequently deposited liquid ink.

Once the ablation process is complete the top electrode 9 is then added to the layered substrate. The top electrode may for example form the pixel electrode in an active matrix display. Preferably, the top electrode is formed in the same process step as forming the electrical interconnection through the via-hole. The conductive material is deposited from liquid phase using solution processing techniques such as, but not limited to, spincasting, ink-jet printing, spray-coating, roller coating spray or blade coating. Preferably, the technique of ink jet printing is used. An example of a material that may be used for the top electrode is a conducting polymer solution/dispersion, such as Baytron PH based on polyethylenedioxythiophene doped with polystyrene sulfonic acid (PEDOT/PSS).

Preferably, the viscosity and solid content of the ink is chosen to be as high as is practical for the printhead that is being used. A high viscosity and high solid content promote deposition of a thick conductive layer, and reduce the risk of the ink dewetting of the edge or the side wall of the via hole.

The electrical interconnection between the electrode 9 and the first conductive layer 2 is achieved by coating or printing conductive material into the via hole. In the case of inkjet printing the amount of liquid printed into the via hole can be adjusted by varying the number of droplets and their volume to be printed into each via hole.

The process of filling the created via hole with conductive material 12, may preferably be conducted by using an ink jet printing system which may dispense a well defined number of picolitre drops at rates in excess of 10 kHz into each via hole. However, the conductive material may also be deposited using other solution processing techniques such as spin, dip, blade, bar, slot-die, gravure, offset or screen printing. The method of ink jet printing deposits only a thin layer of conductive material onto the layered substrate.

The surface properties of the inside surface area of the formed via hole and the properties of the chosen conductive material are such that when deposited into the via hole, the conductive material adheres well to the surface of side wall of the via. This process occurs as the solvent of the deposited conductive material evaporates. This deposited conductive material forms an electrical connection with the remaining ring conductive material of the first conductive layer.

An low power oxygen plasma step after opening of the via holes and prior to the step of depositing the liquid conductive ink can be used to improve the wetting properties of liquid conductive ink on the edge and the side wall of the via-hole. Typical conditions for this step are power=50-200 W, and duration=10-60 s.

Alternatively, the via-holes can be filled by spin-coating a solution of the conducting polymer PEDOT/PSS (Baytron P HC from HC Stark, concentration 20-35% water, 65-80% Baytron P HC) at a spin speed of 2000 rpm onto the substrate, resulting in a 75-100 nm PEDOT film. If the dilution with water is increased further, reduced yield for via-hole interconnection is observed. A surfactant is added to the PEDOT formulation (for example, 0.2% of Neutracon (supplied by Decon) in order to facilitate the formation of a continuous film across the side walls of the via-hole, and achieve a high interconnection yield. The PEDOT top electrode is then patterned in a subsequent step by laser ablation.

The PEDOT top electrode can serve as the pixel electrode to control the optical state of a display element in an active matrix display device, such as a liquid-crystal, an emissive light-emitting diode or an electrophoretic display element. The top electrode may extend laterally over the transistor device in the layers underneath. By integrating the transistor behind the pixel electrode in this way the aperture ratio of the display can be increased.

In a second embodiment of the present invention, the above described process may also be used for connecting multiple conductive layers buried within a layered stack.

A via hole may be formed, for example, between two buried conductive layers, further down within the layered stack. FIG. 6 illustrates the case where two buried layers 2 and 13 are both connected electrically to the top electrode 9 through a via hole interconnection 9'. FIG. 7 illustrates the case where two buried layers 2 and 13 are interconnected with a via hole interconnection 9' without a top electrode. This process might require a greater number of shots per via hole than previously described, such that the depth of the via hole is at least through the upper conductive and insulating layers or deeper to ensure a high yield. As above, once the ablation depth is deeper than the depth of the first conductive layer 2 the process does not require particularly accurate depth control, as the electrical contact is made to a ring of remaining material from this base layer on the substrate.

An occasion may arise where it is necessary to form a via hole between the upper pixel electrode and a conductive layer near the top of the layered stack. In this case, a fewer number of shots per via hole, than previously described, will be required. This is therefore a flexible process that may be used to create via holes between any two conductive layers, positioned at any level within a layered stack.

As described in the first embodiment, the produced debris may be kept to a minimum by applying a jet of gas at the point of ablation to disperse the non-gaseous particles that are ejected. A high velocity jet of gas may remove these particles, such that they do not adhere to the substrate. A jet of clean dry air has been used effectively for this purpose.

The invention is applicable to formation of via hole interconnections to organic transistor devices. Possible materials that may be used for the semiconducting layers, includes any solution processable conjugated polymeric or oligomeric material that exhibits adequate field-effect mobilities exceeding $10^{-3}$ cm$^2$/Vs and preferably exceeding $10^{-2}$ cm$^2$/Vs. Materials that may be suitable have been previously reviewed, for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or nanowires such as silicon nanowires.

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999

(1997)), and photolithographic patterning (see WO 99/10939), offset printing, flexographic printing or other graphic arts printing techniques. However, ink-jet printing is considered to be particularly suitable for large area patterning with good registration, in particular for flexible plastic substrates. In the case of surface-energy direct deposition, materials may also be deposited by continuous film coating techniques such as spin, blade or dip coating, which are then able to be self-patterned by the surface energy pattern.

Although preferably all layers and components of the device and circuit are deposited and patterned by solution processing and printing techniques, one or more components may also be deposited by vacuum deposition techniques and/or patterned by photolithographic processes.

Devices such as TFTs fabricated as described above may be part of more complex circuits or devices, in which one or more such devices can be integrated with each other and/or with other devices. Examples of applications include logic circuits and active matrix circuitry for a display or a memory device, or a user-defined gate array circuit.

Patterning processes, as described above, may also be used to pattern other circuitry components, such as, but not limited to, interconnects, resistors and capacitors. A particular application of the application is the formation of via hole interconnections between the pixel electrode of an active matrix display and one of the electrodes of the pixel transistor.

The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of producing an electronic device including the steps of:

(i) providing a body including a first conductive element separated from a first surface of said body by a portion of said body including at least one non-conductive layer;

(ii) removing a selected portion of said body to define a recess in said body extending from said first surface down through said at least one non-conductive layer above said first conductive element and through said first conductive element to below said first conductive element and via which a portion of said first conductive element is exposed; and (iii) depositing a conductive material into said recess through said at least one non-conductive layer above said first conductive element and through said first conductive element to below said first conductive element, to provide a conductive connection between said exposed portion of said first conductive element and a second conductive element above said at least one non-conductive layer, wherein said first conductive element is part of a patterned conductor layer forming source and drain electrodes of a transistor device, and wherein said second conductive element comprises a pixel electrode.

2. The method according to claim 1, wherein the recess in said body is defined by laser ablation of said body.

3. The method according to claim 1, wherein the thickness of said body in between said first surface of said body and said first conductive element exceeds 1 µm.

4. The method according to claim 3, wherein the thickness of said body in between said first surface of said body and said first conductive element exceeds 5 µm.

5. The method according to claim 1, wherein said conductive material deposited in said recess is not used to form any conductive connection to any conductive element below said first conductive element.

6. The method according to claim 1, wherein said second conductive element is conductively connected to said first conductive element only via said conductive material deposited in the recess.

7. The method according to claim 1, wherein said first conductive element is the lowest conductive element to which the recess is to be used to provide a conductive connection from said second conductive element.

8. The method according to claim 1, wherein said pixel electrode is a pixel electrode for an active-matrix display.

9. The method according to claim 1, wherein said transistor device comprises a gate electrode, and said at least one non-conductive layer comprises a dielectric layer between said gate electrode and said pixel electrode.

10. The method according to claim 9, wherein said pixel electrode is a pixel electrode for an active-matrix display.

* * * * *